United States Patent
Kawano et al.

(10) Patent No.: US 7,009,148 B2
(45) Date of Patent: Mar. 7, 2006

(54) METHOD OF PROCESSING A SUBSTRATE, HEATING APPARATUS, AND METHOD OF FORMING A PATTERN

(75) Inventors: Kenji Kawano, Yokohama (JP); Shinichi Ito, Yokohama (JP); Eishi Shiobara, Inagi (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/682,419

(22) Filed: Oct. 10, 2003

(65) Prior Publication Data

US 2004/0121617 A1 Jun. 24, 2004

(30) Foreign Application Priority Data

Oct. 11, 2002 (JP) ............... 2002-299576

(51) Int. Cl.
*F27B 5/14* (2006.01)
(52) U.S. Cl. .............. 219/411; 219/390; 219/405; 392/416; 392/418; 18/724; 18/725; 18/50.1
(58) Field of Classification Search ............ 219/390, 219/405, 411; 392/416, 418; 118/724, 725, 118/50.1
See application file for complete search history.

(56) References Cited

U.S. PATENT DOCUMENTS

| 6,222,990 B1 * | 4/2001 | Guardado et al. .......... 392/416 |
| 6,265,696 B1 | 7/2001 | Sakurai et al. |
| 6,301,435 B1 | 10/2001 | Ito et al. |
| 6,333,493 B1 | 12/2001 | Sakurai et al. |
| 6,376,806 B1 * | 4/2002 | Yoo ........................ 219/411 |
| 6,550,990 B1 | 4/2003 | Sakurai et al. |

FOREIGN PATENT DOCUMENTS

| JP | 6-124873 | 5/1994 |
| JP | 11-038644 | 2/1999 |
| JP | 2000-082661 | 3/2000 |
| JP | 2000-146444 | 5/2000 |
| JP | 2002-252167 | 9/2002 |

OTHER PUBLICATIONS

Kawano, K. et al., "Apparatus For Processing Substrate and Method of Processing The Same", U.S. Appl. No. 10/026,419, filed Dec. 26, 2001.

Kihara, N. et al., "Effect of Acid Evaporation in Chemically Amplified Resists on Insoluble Layer Formation", Journal of Photopolymer Science and Technology, vol. 8, No. 4, pp. 561-569, (1995).

* cited by examiner

*Primary Examiner*—Shawntina Fuqua
(74) *Attorney, Agent, or Firm*—Finnegan, Henderson, Farabow, Garrett & Dunner, L.L.P.

(57) ABSTRACT

A method of processing a substrate, comprising forming a chemically amplified resist film on a substrate, irradiating energy beams to the chemically amplified resist film to form a latent image therein, carrying out heat treatment with respect to the chemically amplified resist film, heating treatment being carried out in a manner of relatively moving a heating section for heating the chemically amplified resist film and the substrate forming a gas stream flowing reverse to the relatively moving direction of the heating section between the lower surface of the heating section and the chemically amplified resist film.

17 Claims, 10 Drawing Sheets

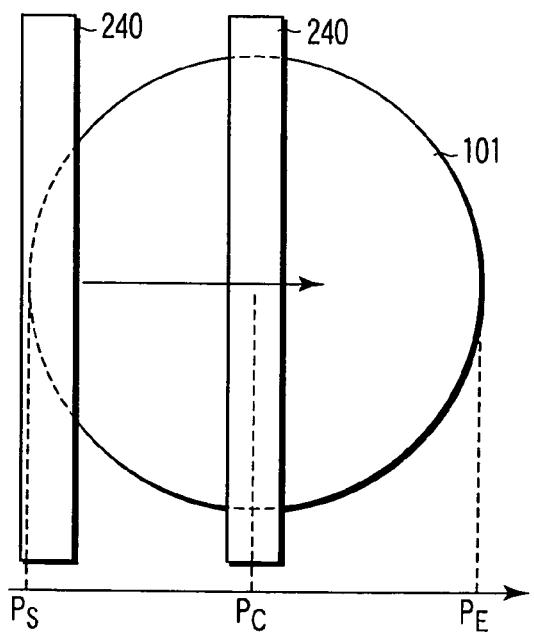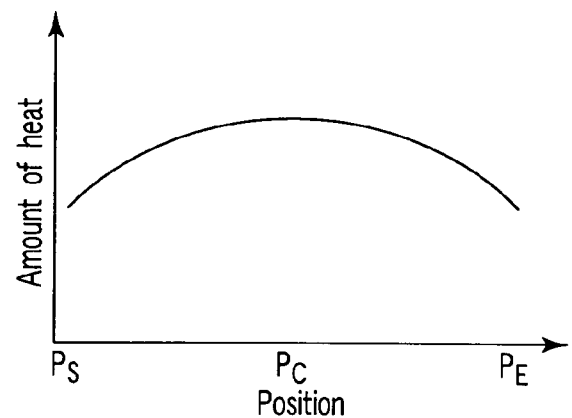
FIG. 6          FIG. 7
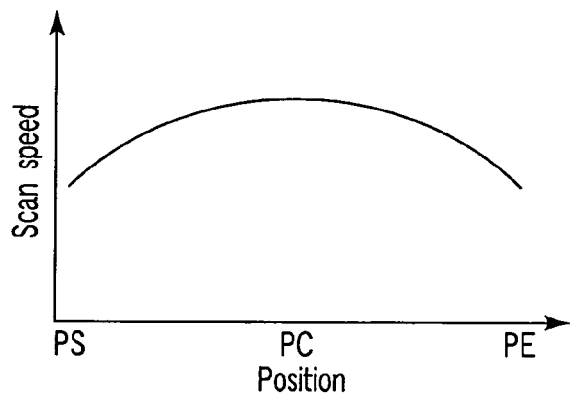
FIG. 8A
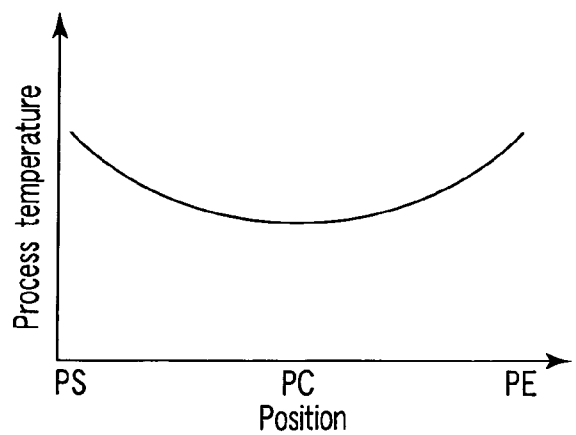
FIG. 8B

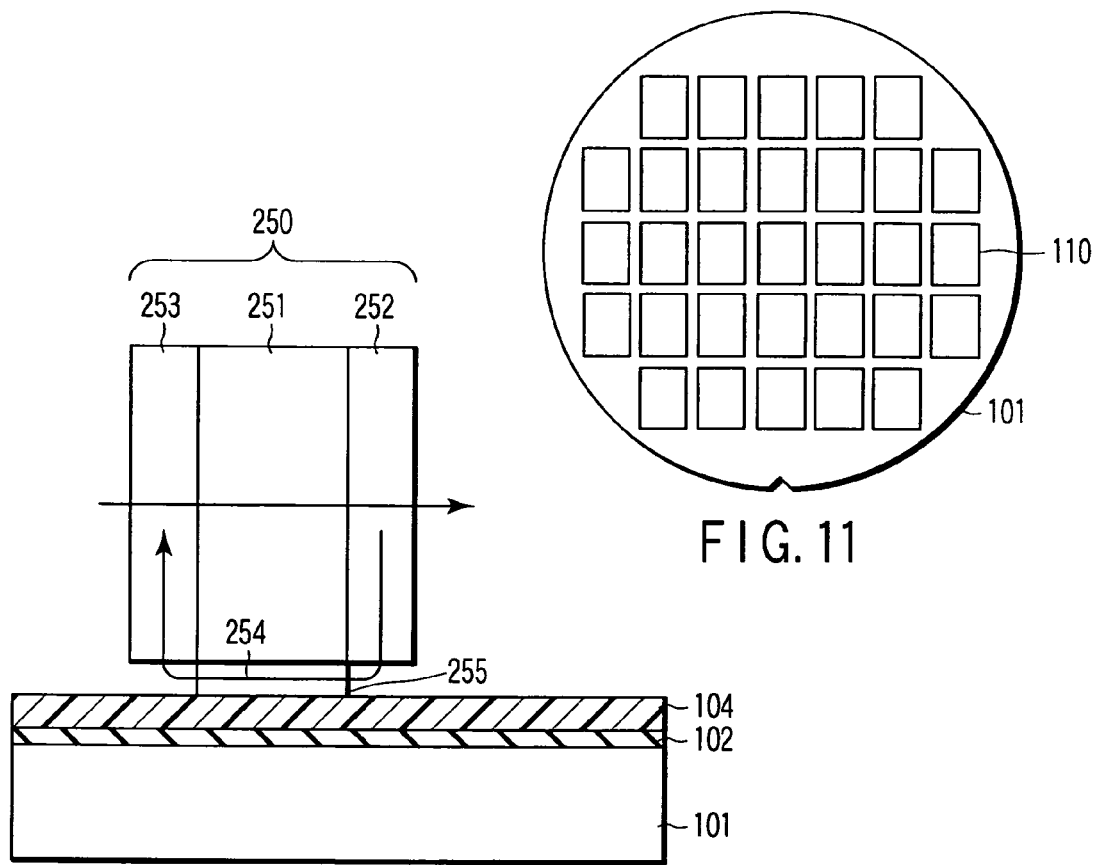
FIG. 9
FIG. 11
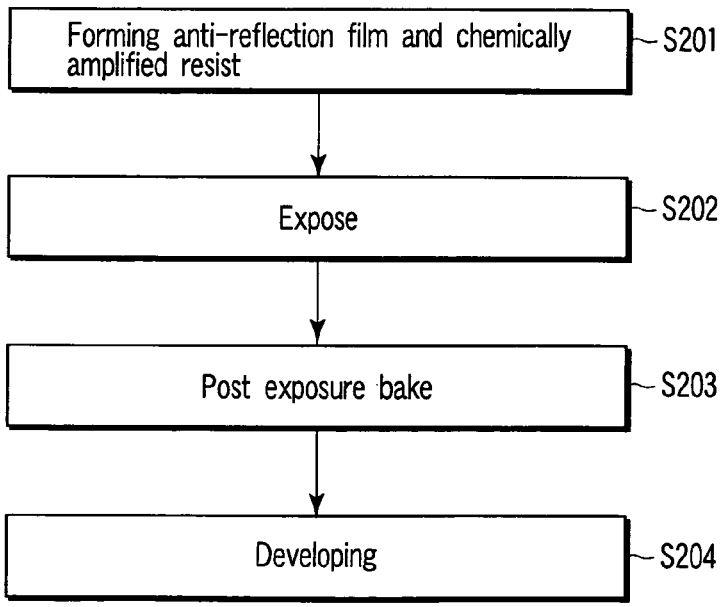
FIG. 10

METHOD OF PROCESSING A SUBSTRATE, HEATING APPARATUS, AND METHOD OF FORMING A PATTERN

CROSS-REFERENCE TO RELATED APPLICATIONS

This application is based upon and claims the benefit of priority from the prior Japanese Patent Application No. 2002-299576, filed Oct. 11, 2002, the entire contents of which are incorporated herein by reference.

BACKGROUND OF THE INVENTION

1. Field of the Invention

The present invention relates to method and apparatus for carrying out heat treatment with respect to a substrate, and to a method of forming a photo resist film or chemically amplified resist film pattern on a substrate.

2. Description of the Related Art

In the process of manufacturing semiconductor devices, resist pattern is used to form element regions and to process electrode interconnects. The resist pattern is formed in the following manner in general. A resist coating film is formed on semiconductor wafer, and thereafter, heat treatment calling pre-bake is carried out. The pre-bake is carried out to volatilize solvent contained in the resist. Predetermined pattern is transferred to the resist film by exposure.

With micro-fabrication of semiconductor elements, high resolution is required in the lithography process. In order to meet the requirement, the wavelength of used exposure light is shortened. In photolithography, KrF excimer laser (wavelength: 248 nm) has been widely used as an exposure light source.

On the other hand, as the wavelength of exposure light is shortened, photo resist calling chemically amplified resist has been proposed and practically used as the photo resist material to which pattern is transferred. The chemically amplified resist contains acid generating agent generating acid by exposure. The acid generated by exposure decomposes resin (positive-tone resist), and cross-links it (negative-tone resist). This serves to make use of the property such that solubility to developer changes in the development process after that.

The chemically amplified resist has property excellent in resolution while it is very delicate with respect to environment. More specifically, the chemically amplified resist reacts with basic substances in atmosphere; for this reason, acid is inactivated. This is a factor of causing degradation in pattern shape and resolution. In order to prevent the degradation, environmental control is carried out. In general, the environmental control is carried out in a manner of providing chemical filters in an aligner (exposure system) and in a coater developer for making resist coating and developing processes.

Most of the chemically amplified resists require heat treatment process calling PEB (Post Exposure Bake) after exposure process. The PEB is carried out in order to diffuse acid generated in the exposure process. The PEB process is carried out, and thereafter, the chemically amplified resist is developed so that resist pattern can be formed.

In the PEB process, there has been known that acid is evaporated in addition to the foregoing acid inactivation. Some methods have been conventionally proposed as the method of preventing the acid evaporation of the chemically amplified resist in the PEB process. For example, one is the method of setting pre-bake temperature used for volatilizing solvent after resist coating higher than usual, and setting PEB temperature lower than usual, and thereby, reducing acid evaporation. (See Effect of acid evaporation in chemically amplified resists on insoluble layer formation, Journal of photopolymer science and technology Vol. 8, Number 4 (1995) p. 561–570). Another is the method of carrying out the PEB process under the pressure higher than usual, and thereby, reducing acid evaporation (See JPN. PAT. APPLN. KOKAI No. 11-38644).

The pre-bake temperature and the PEB temperature are changed, and thereby, the acid evaporation in the PEB process can be reduced. However, pre-bake and PEB processes are carried out under conditions largely diverging from the optimized temperature condition (normal condition). For this reason, it is difficult to sufficiently show performances such as exposure and focus margin the resists possess naturally.

In the PEB process, a heating apparatus, which can solve the following problem, is required. Namely, gas and fine grain generated in heating adhere into a chamber; therefore, this is a source of the generation of particle. For this reason, it is general that purge air stream is formed in the chamber of the heating section. However, acid evaporated in PEB is carried to the downstream side by the purge air stream, and adsorbs to the surface of resist film. Therefore, acid concentration on resist surface differs in chips situated on the most upperstream to the air stream and chips situated on the downstream side. As a result, non-uniformity occurs in resist dimension in the wafer surface after development.

If pressure is set higher in the PEB process, acid evaporation is reduced; however, suitable course is not taken to the problem that the adsorption of the evaporated acid. The evaporated acid adsorbs to semiconductor wafer: for this reason, it is difficult to prevent the occurrence of non-uniformity of resist dimension in the wafer surface after development.

BRIEF SUMMARY OF THE INVENTION

According to one aspect of the present invention, there is provided a method of processing a substrate, comprising:
forming a chemically amplified resist film on a substrate;
irradiating energy beam to the chemically amplified resist film so that a latent image can be formed therein; and
carrying out heat treatment with respect to the chemically amplified resist film,
heating (heat treatment) being carried out in a manner of relatively moving a heating section for heating the chemically amplified resist film and the substrate while forming a air stream flowing reverse to the relatively moving direction of the heating section between the lower surface of the heating section and the chemically amplified resist film.

According to one aspect of the present invention, there is provided a method of processing a substrate, comprising:
forming a chemically amplified resist film on a substrate;
irradiating energy beam to the chemically amplified resist film so that a latent image can be formed therein; and
carrying out heat treatment with respect to the chemically amplified resist film,
heating (heat treatment) being carried out in a manner of relatively moving a heating section for heating the chemically amplified resist film and the substrate while forming a liquid stream flowing reverse to the relatively moving direction of the heating section between the lower surface of the heating section and the chemically amplified resist film.

According to one aspect of the present invention, there is provided a method of processing a substrate, comprising:

forming a liquid film containing solvent and solid content on a substrate; and volatilizing the solvent contained in the liquid film to forming a solid film consisting of the solid content, heating (heat treatment) being carried out in a manner of relatively moving a heating section for heating the liquid film and the substrate while forming an air stream between a heating range and the heating section.

According to one aspect of the present invention, there is provided a heating apparatus comprising:

holding means for holding a substrate;

a heating section arranged in a state of facing the surface of the substrate held by the holding means, and selectively heating a partial range of the substrate;

moving means for relatively moving the heating section and the substrate in parallel to the main surface of the substrate;

stream forming means for forming air or liquid stream between the heating section and the substrate;

processing condition determining means for determining processing conditions of a heating range heated by the heating section; and control means for uniformly heating the substrate surface based on determination by the processing condition determining means.

According to one aspect of the present invention, there is provided a method of forming a pattern, comprising:

forming a photo resist film on a substrate;

forming liquid film on the photo resist film surface;

irradiating energy beams to the photo resist film via the liquid film so that a latent image can be formed; and developing the photo resist film formed with the latent image, the surface of the photo resist film being not dried until developing is carried out after the liquid film is formed.

According to one aspect of the present invention, there is provided a method of forming a pattern, comprising:

forming a chemically amplified resist film on a substrate;

forming liquid film on the chemically amplified resist film surface;

irradiating energy beams to the chemically amplified resist film via the liquid film so that a latent image can be formed;

carrying out a post exposure bake process with respect to the chemically amplified resist film formed with the latent image, and developing the chemically amplified resist film subjected to the post exposure bake process, the surface of the photo resist film being not dried until developing is carried out after the liquid film is formed.

BRIEF DESCRIPTION OF THE SEVERAL VIEWS OF THE DRAWING

FIG. 6 is a plan view to explain heat treatment according to the first embodiment;

FIG. 7 is a characteristic diagram showing amount of heat to wafer position;

FIG. 8A and FIG. 8B are characteristic diagrams showing scan speed and process temperature to wafer position, respectively;

FIG. 9 is a schematic view showing a heating apparatus according to a second embodiment of the present invention;

FIG. 10 is a flowchart to explain a substrate processing method according to a third embodiment of the present invention;

FIG. 11 is a plan view schematically showing exposure shot position transferred onto wafer;

DETAILED DESCRIPTION OF THE INVENTION

Embodiments of the present invention will be described below with reference to the accompanying drawings.

(First Embodiment)

Figure 1:
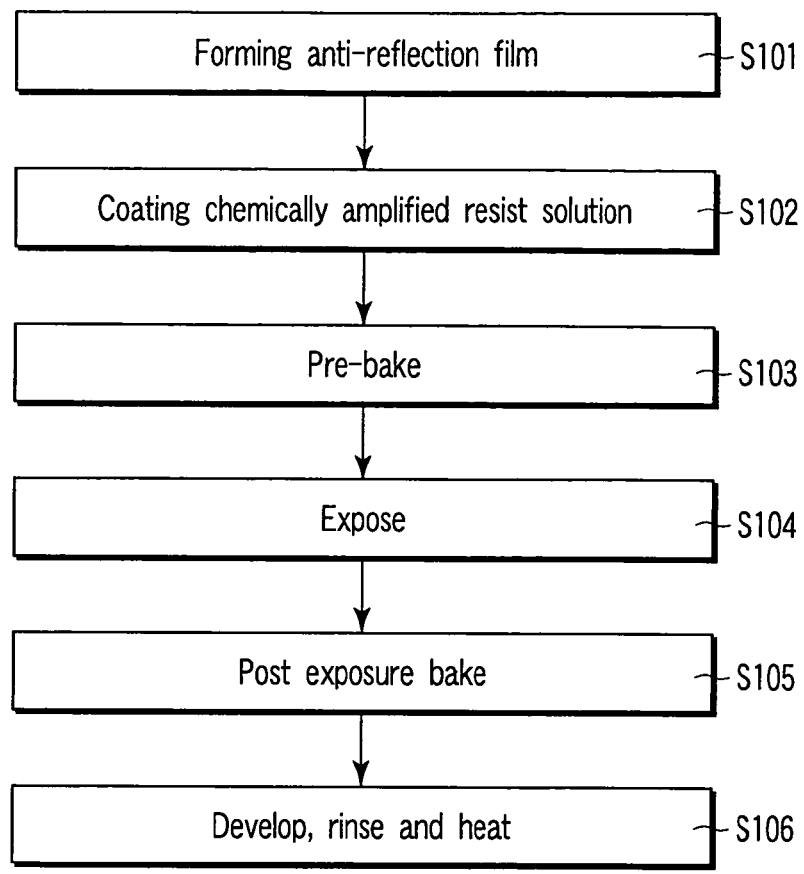
FIG. 1 is a flowchart to explain a substrate processing method according to a first embodiment of the present invention.

FIG. 1 is a flowchart to explain a substrate processing method according to a first embodiment of the present invention. FIG. 2A to FIG. 2D are cross-sectional views showing the process of manufacturing a semiconductor device according to the first embodiment of the present invention. The first embodiment will be described with reference to FIG. 1 and FIG. 2A to FIG. 2D.

(Step S101)

Figure 2A:
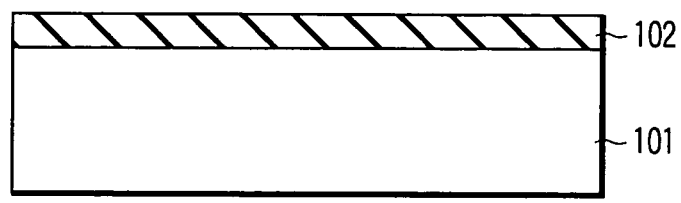
FIG. 2A to FIG. 2D are cross-sectional views showing the process of manufacturing a semiconductor device according to the first embodiment.

As shown in FIG. 2A, an anti-reflection film 102 having a thickness of 60 nm is formed on a semiconductor substrate (hereinafter, referred to as wafer) 101 having a diameter of 200 mm. The anti-reflection film 102 is formed in a manner of carrying out bake process at 190° C. for 60 seconds after forming a liquid film containing anti-reflection agent and solvent by spin coating.

(Step S102)

Figure 2B:
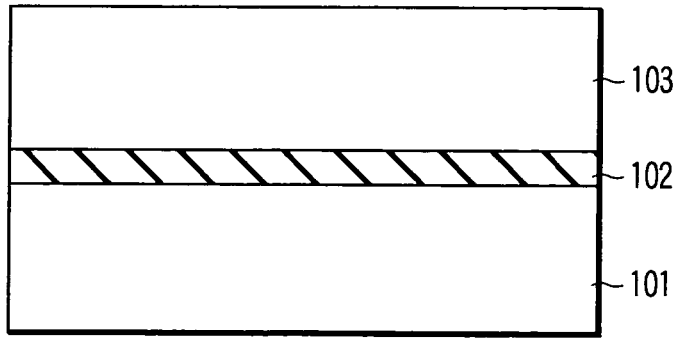

As illustrated in FIG. 2B, the wafer 101 is coated with chemically amplified resist solution in which positive-tone chemically amplified resist material is added to solvent, and thereby, liquid film 103 is formed. The chemically amplified resist solution used in the embodiment consists of mixed solvent of lactic acid ethyl and 3-ethoxy propionic acid ethyl using phenol resin as base polymer.

(Step S103)

Figure 2C:
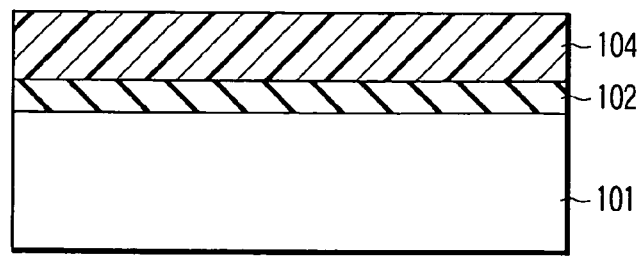

As depicted in FIG. 2C, pre-bake process is carried out, and thereby, solvent contained in the liquid film 103 is volatilized so that a positive-tone chemically amplified resist film 104 can be formed. The pre-bake process is carried out under the following condition, that is, at the temperature of 130° C. for 60 seconds.

(Step S104)

Figure 3A:
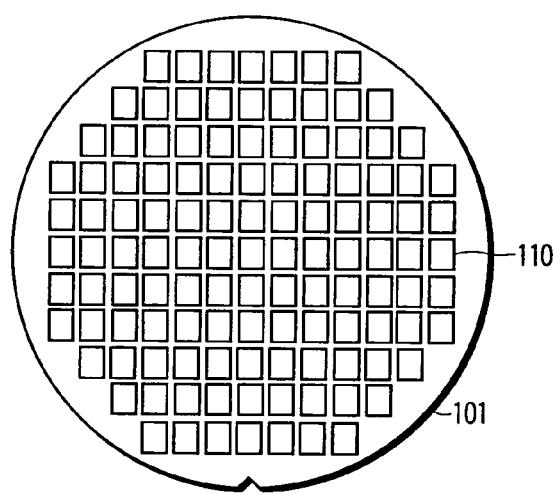
FIG. 3A is a plan view showing the entity of wafer.
Figure 3B:
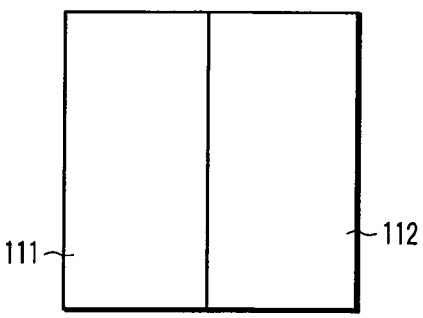
FIG. 3B is a plan view schematically showing a pattern formed in each chip region of the wafer.
Figure 3C:
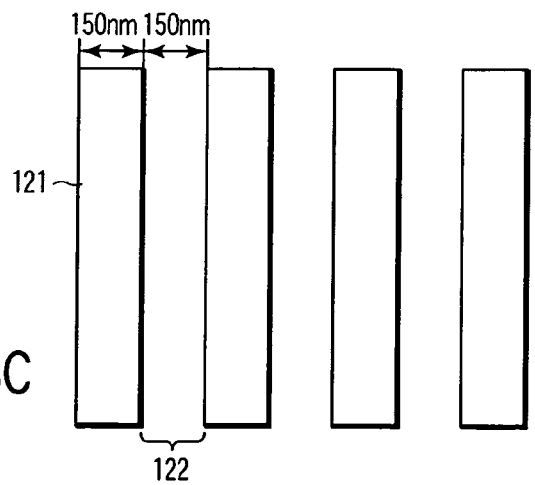
FIG. 3C is a plan view schematically showing a line pattern of the chip region.

After pre-bake, the wafer 101 is cooled down by room temperature, and thereafter, carried to an aligner (exposure system) using a KrF excimer laser (wavelength: 248 nm) as a light source. Reduction projection exposure is carried out via an exposure mask. As seen from FIG. 3A, reticle pattern is transferred to each of preset chip regions 110 having 11×13 in lengthwise and crosswise, and thereby, latent image is formed in the chemically amplified resist film 104. FIG. 3B schematically shows pattern transferred to each chip region 110. One exposure region (hereinafter, referred to as exposure shot) is composed of a left-half line pattern area 111 and an area 112 where no resist is left after development. FIG. 3C is an enlarged view of the line pattern 111. Line/space pattern (line 121 having a width of 150 nm and space 122 having a width of 150 nm) is repeatedly arranged with the pitch of 300 nm.

Any of ultraviolet radiation, deep-ultraviolet radiation, vacuum ultraviolet radiation, electron beam and X rays may be used as the exposure wavelength.

(Step S105)

Figure 4:
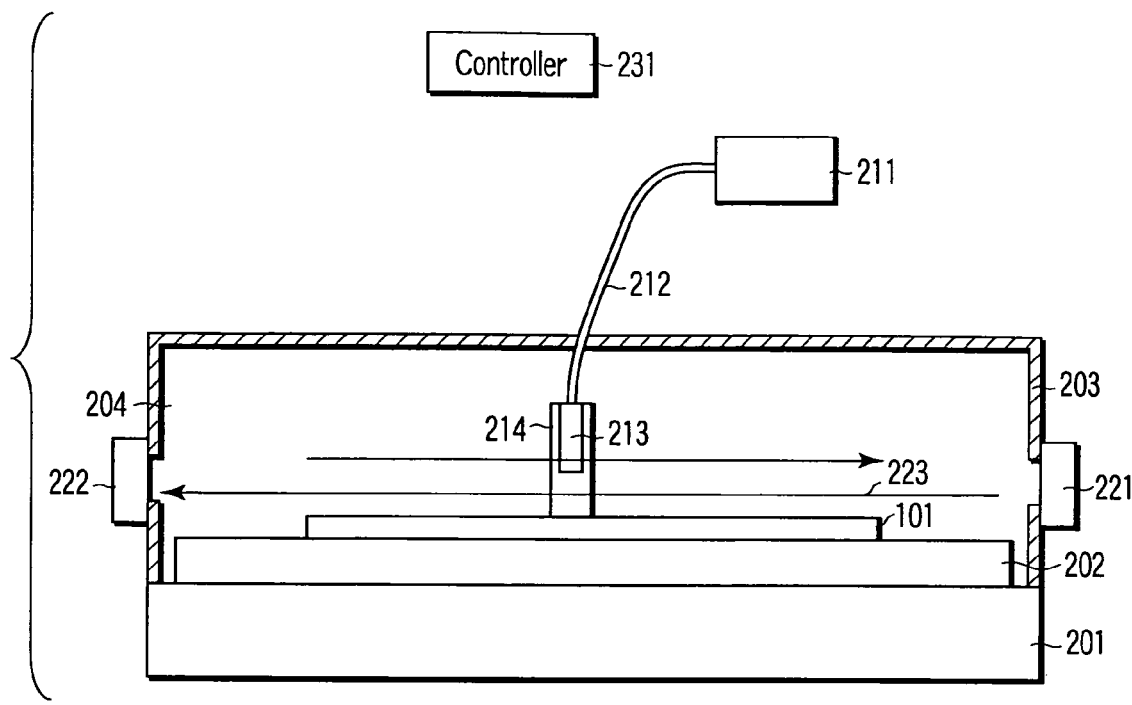
FIG. 4 is a cross-sectional view schematically showing the structure of a heating apparatus according to the first embodiment.
Figure 5:
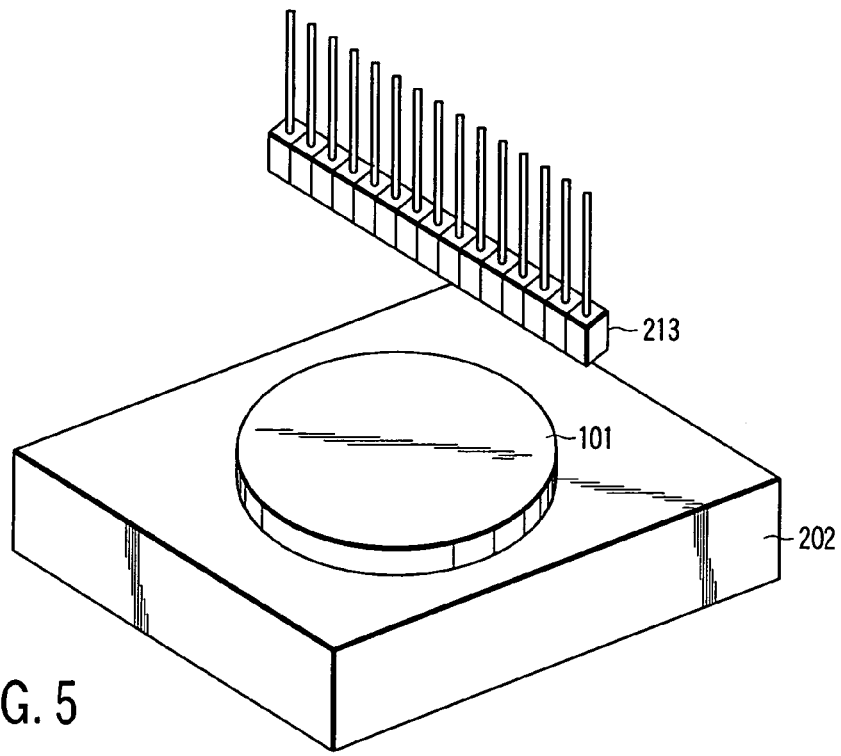
FIG. 5 is a perspective view schematically showing the structure of a heating apparatus according to the first embodiment.

The wafer is carried to the heating apparatus, and thereafter, subjected to post exposure bake (PEB) process. The structure of the heating apparatus carrying out the PEB process will be described with reference to FIG. 4 and FIG. 5. FIG. 4 and FIG. 5 are view schematically showing the structure of the heating apparatus according to the first embodiment of the present invention. FIG. 4 is a cross-sectional view showing the structure of the heating apparatus. FIG. 5 is a perspective view schematically showing the structure of the heating apparatus.

As seen from FIG. 4 and FIG. 5, the wafer 101 is placed on a temperature control plate 202 on a base 201. A cover 203 is located to cover the wafer 101. It is preferable that atmospheric control is made in a space 204 covered with the cover 203 and the temperature control plate 202.

Light from a halogen lamp light source 211 is introduced to several heating heads 213 via several optical fibers 212. The heating head 213 is provided above the wafer 101. The light from the halogen lamp light source 211 is selectively irradiated to the wafer 101 via an objective lens included in the heating head 213. In the apparatus, the selectively irradiated light has a slit-like irradiation range having a length of 220 mm and a width of 5 mm.

The heating head 213 is supported by a moving mechanism 214. The heating head 213 is movable to one direction by moving the moving mechanism 214. The heating head 213 moves from one end of the wafer 101 to the other end thereof, and thereby, desired heat treatment is carried out with respect to the wafer 101.

The cover 203 is connected with an air blower 221 and an air sucker 222. The line connecting the air blower 221 and the air sucker 222 and the moving direction of the heating head 213 are approximately parallel with each other. Air stream 223 introduced into the space 204 from the air blower 221 is supplied to the direction reverse to the moving direction of the heating head 213. The air stream flows between the heating head 213 and the wafer 101, and thereafter, sucked by the air sucker 222.

The apparatus is provided with a controller 231 for controlling halogen lamp light source 211, moving mechanism 214, air blower 221 and air sucker 222.

The following is a description on the case of carrying out PEB process of chemically amplified resists film using the apparatus having the structure described above.

The wafer 101 is placed on the temperature-controlled plate 202, and thereafter, the cover 203 is set. Thereafter, the heating head 213 is moved, and the irradiation range 240 is moved from the left side to the right side on the paper, as shown in FIG. 6. In this case, the air blower 221 and the air sucker 222 are operated so that the air stream 223 flowing from the right to the left side. In this case, the temperature-controlled plate 202 is controlled to the temperature of 23° C., and only light irradiation range by the heating head 213 is heated.

Acid generated in the resist film by exposure is evaporates by heat treatment by light irradiation, and thereafter, is carried to the downstream side by the air stream. For this reason, the evaporated acid adsorbs to the resist film surface. However, the region where acid adsorbs adheres is a region already heated, and the region is controlled to low temperature. Thus, it is possible to greatly prevent reaction of the adsorbed acid with resist film.

In view of resist dimension uniformity in the wafer after being developed, uniform calorie must be given to the wafer in the PEB process. As seen from FIG. 6, the ratio occupied by wafer edge to irradiated area is larger than the wafer central portion in the edge of the wafer 101; therefore, heat is easily released. If irradiation heating is carried out at the same scan speed, the calorie become small at the wafer edge portion, as seen from FIG. 7. As a result, resist dimension uniformity is not obtained. In order to make uniform the amount of heat on the wafer surface, the scan speed is reduced at the wafer edge portion (see FIG. 8A) while process temperature is made high at there (see FIG. 8B). By doing so, resist dimension uniformity is obtained. The following methods are given to control the process temperature. One is the method of controlling the luminance of the light source, and another is the method of controlling the flow speed of the air stream.

Incidentally, the heating section is not limited to the structure of irradiating light from the light source. For example, the apparatus is provided with a heating section (including light source), and heat generated from the heating section may be conducted to resist film. In addition, any of lamp, light emitting diode and laser is used as the light source, and thereby, the resist film may be heated by light radiation.

(Step S106)

Figure 2D:
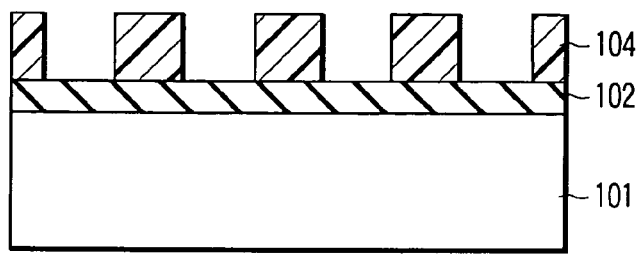

The wafer is cooled down by room temperature. The wafer is carried to a development unit, and thereafter, subjected to alkali development process for 60 seconds. After the development process, rinse and spin dry processes are carried out, and thereby, resist pattern is formed as shown in FIG. 2D.

The following is descriptions of the comparative result of resist pattern dimension surface distribution in the case where PEB process is carried out using the heating apparatus of the first embodiment and the conventional heating apparatus.

A heating apparatus forming one-direction air stream will be described as one example of the conventional heating apparatus. In the apparatus, wafer is heated so that the surface temperature distribution becomes uniform in a state that there exists air stream flowing to one direction, and thereafter, PEB process is carried out.

Resist pattern is formed using the heating apparatus. The process of forming transferred resist pattern and resist pattern is the same as described above; therefore, the explanation is omitted.

PEB process and development are carried out using the conventional heating apparatus. Thereafter, the resist pattern is observed from top using SEM (Scanning Electron Microscope), and each exposure shot is inspected. As a result, exposure chip situated on the most upstream side to air stream in heating is defective. Incidentally, chips having unresolved resist pattern is determined as being defective.

Likewise, pattern transfer is carried out using the heating apparatus of the embodiment, and evaluation is made. As a result, no defective exposure chip is observed on the wafer surface, and preferable pattern transfer is obtained.

The heat treatment described above is carried out, and thereby, it is possible to greatly restrict thermal reactions of adsorbed acid. Therefore, exposure is effectively applied without being changed by the adsorbed acid, so that resist dimension uniformity can be improved.

According to the first embodiment, the pattern shown in FIG. 3C is used as evaluation because the evaluation is briefly made. The present invention is not limited to the pattern; in this case, other arrangement patterns can obtain the same effect.

In the embodiment, light of the light source outside the heating apparatus is introduced using several optical fibers. The present invention is not limited to the arrangement; in this case, a lamp may be located in the heating apparatus to directly irradiate the light to the wafer.

In the embodiment, the halogen lamp is used as the light source. The present invention is not limited to the halogen lamp; in this case, wafer may be heated using lamps having a wavelength range where resist is not exposed.

In the embodiment, wafer is heated by lamp irradiation. The present invention is not limited to heating by lamp irradiation; in this case, a heating section is used as a heat source, and wafer may be heated using heat conduction.

In the embodiment, the irradiated light has the slit-like irradiation range having the length of 220 mm and the width of 5 mm. The present invention is not limited to the irradiation range; in this case, the slit-irradiation range includes thin and long various shapes such as rectangle and ellipse.

In the embodiment, the heating head used as the heating source is scanned, and thereby, selective heating area is moved in the wafer. In this case, even if the stage holding wafer is moved in a state of fixing the heating head, the same effect can be obtained.

In the embodiment, the stage temperature is set to 23° C. The present invention is not limited to the temperature; in this case, any other temperatures may be set so long as it is less than temperature where effective exposure dose is not changed by thermal reaction of adsorbed acid.

Various modifications may be made in the invention without diverging from the spirit and scope described in the embodiment.

(Second Embodiment)

A heating apparatus different from the first embodiment will be described below.

FIG. 9 is a cross-section view schematically showing a heating apparatus according to the second embodiment of the present invention. The entire structure of apparatus is the same as the first embodiment; therefore, the explanation is omitted.

A head 250 includes a heating section 251, an air blower 252 and an air sucker 253. The heating section 251 irradiates light 255 supplied from one halogen lamp light source (not shown) via optical fiber (not shown) to a chemically amplified resist film 104. The air blower 252 is arranged on the forward side of the moving direction of the head 250; on the other hand, the air sucker 253 is arranged on the backward side of the moving direction thereof.

Gas is introduced from the air blower 252 onto the wafer 101, and sucked by the air sucker 253, and thereby, air stream 254 is formed. The air stream 254 flows from the forward side of the moving direction of the head to the backward side thereof. The wafer 101 is placed on a stage (not shown) controlled to the temperature of 23° C. By doing so, the area where the light 255 is irradiated is selectively heated.

Heating by the irradiation of the light 255 evaporates acid generated in exposure, and the evaporated acid is carried to the downstream side by the air stream 254. The air sucker 253 is located adjacent to the heating section 251; therefore, the acid adsorbed to the surface of the resist film 104 is reduced. Even if acid adsorbs to the surface of the resist film 104, the area to which acid adsorbs is controlled to low temperature; therefore, there is almost no influence given to the area.

The anti-reflection film and resist film are formed in the same manner as the first embodiment, and thereafter, pre-bake (bake before exposure) and exposure are carried out. Thereafter, PEB process is carried out using the apparatus shown in FIG. 9. The wafer is cooled down, and thereafter, development, rinse and dry processes are carried out in the same manner as the first embodiment. By doing so, resist pattern comprising a 110 nm line and space pattern is formed.

The formed line dimension is measured in the wafer surface. As a result, the surface dimension variation of the 110 nm line and space pattern is greatly reduced as compared with the conventional case. More specifically, the dimension variation is 4.1 nm; on the contrary, it is 9.5 nm (3σ) in the case of carrying out heating process using the conventional heating apparatus.

The second embodiment has explained about the 110 nm line and space pattern. The present invention is not limited to the pattern described above; in this case, the same effect is obtained even if other patterns are formed.

According to the second embodiment, one heating head is used; however, the present invention is not limited to one heating head. Several heating heads and air stream forming mechanism are used, and thereby, process time can be greatly reduced.

The second embodiment has explained about the case applied to the process of heat treatment after exposure (PEB). The embodiment may be applied to other process, for example, heat treatment process after coating film formation.

(Third Embodiment)

FIG. 10 is a flowchart to explain a substrate processing method according to a third embodiment of the present invention.

(Step S201)

The anti-reflection film and the chemically amplified resist film are formed on the semiconductor substrate in the same manner as the first embodiment.

(Step S202)

After pre-bake, wafer is cooled down by room temperature, and thereafter, carried to an immersion type aligner (exposure system) using a KrF excimer laser (wavelength: 248 nm) as a light source. Reduction projection exposure is carried out via an exposure mask in a state that the wafer is immersed in pure water. The following evaluation pattern is used. According to the pattern, pattern having line dimension of 130 nm and space dimension of 130 nm is repeatedly arranged in one exposure shot with a pitch of 260 nm. As shown in FIG. 11, the exposure shot 110 is transferred onto the wafer 101 with the arrangement of 5×7 in lengthwise and crosswise, and latent image is formed in positive-tone chemically amplified resist.

If the wavelength of the light source is generally longer than 193 nm, it is preferable to use pure water as the liquid film. If the wavelength of the light source is generally 157 nm, it is preferable to use fluorine oil as the liquid film.

(Step S203)

The latent image is formed using the immersion type aligner (exposure system), and thereafter, the wafer is carried out of there in a state that pure water liquid film is formed on the resist film surface. The wafer is carried to the heating apparatus in a state that pure water liquid film is formed on the resist film surface, and thereafter, post exposure bake (PEB) process is carried out. The PEB process is carried out in a state that pure water liquid film is formed on the resist film surface.

The PEB process is carried out to diffuse acid generated by exposure. In the semiconductor lithography process, it is general that the wafer is heated in a state of being placed on a temperature-controlled hot plate. Usually, PEB process is carried out at the temperature of 90° C. or more. According to the third embodiment, the following process is employed in order to realize PEB process in a state that pure water liquid film is formed on the resist film surface. More specifically, the wafer is kept at temperature preventing pure water from evaporating, and voltage is applied to diffuse acid. In this case, the reason why voltage is applied in a state of being heated is because of performing effective diffusion.

Figure 12:
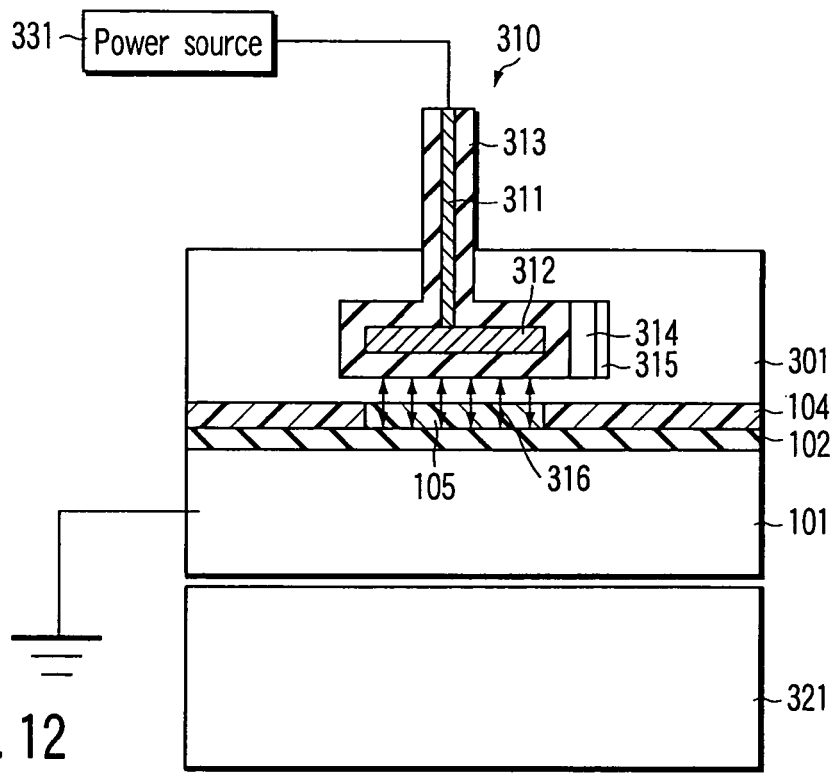
FIG. 12 is a schematic view to explain a PEB process by a heating apparatus according to the third embodiment.
Figure 13:
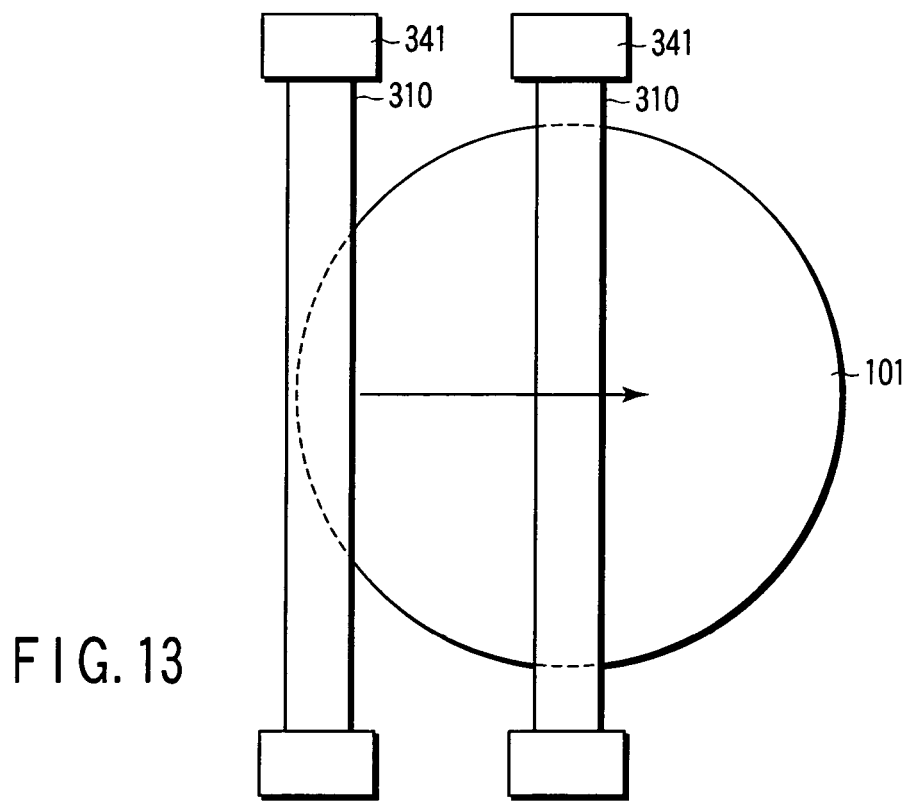
FIG. 13 is a schematic view to explain a PEB process by a heating apparatus according to the third embodiment.

The details will be descried below referring to the accompanying drawings. FIG. 12 and FIG. 13 schematically show the PEB process by the heating apparatus according to the third embodiment of the present invention.

As illustrated in FIG. 12, the wafer 101 is placed on a temperature-controlled plate 321. The anti-reflection film 102 and the chemically amplified resist film 104 are formed on the wafer 101. The surface of the resist film 104 is formed with liquid film of pure water 301. During process, pure water is always kept in a state of flowing on the resist film 104. The wafer (substrate) 101 is connected to ground (earth). The pure water may flow to any directions. However, the flowing direction of the pure water is preferably reverse to the moving direction of the wafer.

The structure of a voltage applying head 310 arranged above the wafer 101 will be described below. An electrode 312 coated with insulator 313 is arranged on the position near to the upper portion of the resist film. The electrode 312 is connected to a power source 331 via electric wire 311. Power is supplied from the power source 331, and thereby, electric field 316 is applied to the resist film 105 between the wafer 101 and the electrode 312. In the third embodiment, the electrode 312 is formed into a slit-like (rectangle) shape having a length of 220 mm and a width of 5 mm.

As seen from FIG. 13, the voltage applying head 310 is movable to one direction on the wafer by a moving mechanism 341. The moving mechanism 341 can control the distance between the lower surface of the voltage applying head 310 and the surface of the resist film 104. The voltage applying head 310 includes a distance sensor 314. The moving mechanism 341 keeps the distance described above at constant in accordance with the measured result by the distance sensor 314 while moving the voltage applying head 310 so that the wafer 101 can be scanned from one end to the other end.

In order to effectively diffuse acid of the resist film 105 to the film thickness direction by the electric field 316, the temperature-controlled plate 321 located on the backside of the wafer 101 heats the wafer 101. In this case, the wafer 101 is arranged separating from the temperature-controlled plate 321 with the distance 0.1 mm.

A temperature sensor 315 included in the voltage applying head 310 monitors the temperature of the resist after being processed. The flow speed of the pure water 301 flowing on the resist film 104 is controlled so that the measurement temperature by the temperature sensor 315 becomes constant. Flowing water forming means (not shown) controls the flow speed of the pure water 301.

In the embodiment, the resist process is carried out under the conditions that application voltage is +2 kV, the distance between resist film surface and the electrode 312 is 100 $\mu$m, and heating temperature is 70° C.

(Step S204)

Uniform PEB process is carried out in the wafer surface using the heating apparatus, and thereafter, the wafer is carried out of the apparatus in a state that pure water liquid film is formed on the resist film surface. The wafer is carried to a developer in a state that pure water liquid film is formed on the resist film surface, and developed using alkali developer.

In this case, pure water existing on the resist film surface must be effectively substituted for the alkali developer. Here, a developer disclosed in U.S. Pat. No. 6,550,990 may be used as the developer.

After development is completed, dry process is carried out, and thus, resist pattern is formed.

As described above, according to the lithography process using immersion exposure, liquid film formed on the resist film surface after exposure process is subjected to development process without drying it. Therefore, it is possible to lithography process simplifying the process.

PEB process is carried out in water; therefore, acid generated from the resist film surface is trapped by pure water. As a result, it is possible to greatly prevent acid from adsorption to the resist film surface. Thus, effective exposure has no variations by adsorbed acid in the wafer surface; as a result, resist dimension uniformity can be improved. More specifically, the dimension variation is reduced from 7.8 to 4.7 nm at 3σ in the wafer surface of repeated pattern having the ling dimension of 130 nm and the space dimension of 130 nm.

In the embodiment, the PEB process is carried out the conditions that application voltage is +2 kV based on the used resist characteristic, the distance between resist film surface and the electrode 312 is 100 $\mu$m, and heating temperature is 70° C. The present invention is not limited to the foregoing conditions. It is important that the conditions are properly set in accordance with the PEB process of the used resist.

In the embodiment, the voltage applying head scans on the wafer surface, and thereby, the voltage application area is moved in the wafer. The same effect is obtained even if the wafer is moved in a state that the voltage applying head is fixed.

In the embodiment, repeated pattern having the ling dimension of 130 nm and the space dimension of 130 nm is used. The present invention is not limited to the pattern; in this case, the same effect is obtained even if other patterns are used.

In the embodiment, lithography process carrying out PEB process is carried out. The present invention is not limited to the lithography process. Possibly, there exists the case where PEB process is not carried out depending on the used resist. In this case, the PEB process is omitted from the process of the embodiment.

In the embodiment, the process until development is carried out in a state that liquid film is formed, and the present invention is not limited to the process. For example, the humidity is controlled to 80% or more during process, and thereby, wafer is processed without drying liquid on the resist film surface. In this case, there is no need of effectively substituting pure water for alkali developer in development; therefore, a normal developer may be used. Besides, various modifications may be made in the invention without diverging from the spirit and scope.

(Fourth Embodiment)

The substrate processing method of the fourth embodiment will be described below. The procedure is the same as the third embodiment; therefore, the flowchart is omitted.

An anti-reflection film having a thickness of 100 nm is formed on a semiconductor substrate (hereinafter referred to as wafer) having a diameter of 300 mm. The anti-reflection film is formed in the following manner. More specifically, liquid film containing anti-reflection agent and solvent is formed by spin coating, and thereafter, is subjected to bake process at temperature of 190° C. for 60 seconds.

A positive-tone chemically amplified resist film having a thickness of 400 nm is formed on the anti-reflection film. The resist film is formed in the following manner. More specifically, liquid film containing chemically amplified resist agent and solvent is formed by spin coating, and thereafter, heat treatment calling pre-bake is carried out at temperature of 130° C. for 90 seconds. The pre-bake is the process for volatilizing the solvent contained the resist.

After pre-bake, wafer is cooled down by room temperature, and thereafter, carried to an immersion type aligner (exposure system) using a ArF excimer laser (wavelength: 193 nm) as a light source. Reduction projection exposure is carried out via an exposure mask in a state that the wafer is immersed in pure water. The following evaluation pattern is used. According to the pattern, pattern having line dimension of 100 nm and space dimension of 100 nm is repeatedly arranged in one exposure shot with a pitch of 200 nm. A plurality of exposure shots is transferred onto the wafer, and latent image is formed in positive-tone chemically amplified resist. In this case, the apparatus disclosed in JPN. PAT. APPLN. KOKAI No. 6-124873 may be used as the immersion type aligner (exposure system).

The latent image is formed using the immersion type aligner (exposure system), and thereafter, the wafer is carried out of there in a state that pure water liquid film is formed on the resist film surface. The wafer is carried to the heating apparatus in a state that pure water liquid film is formed on the resist film surface, and thereafter, post exposure bake (PEB) process is carried out. The PEB process is carried out in a state that pure water liquid film is formed on the resist film surface.

Figure 14:
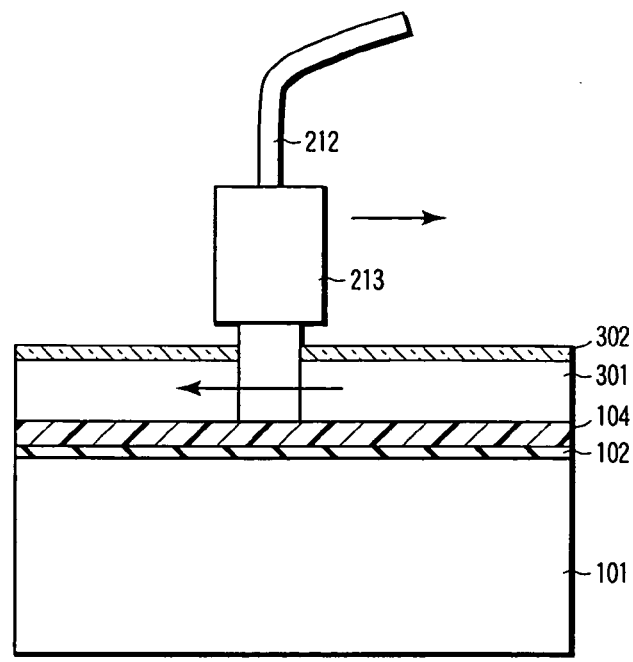
FIG. 14 is a schematic view to explain a PEB process by a heating apparatus according to a fourth embodiment.

FIG. 14 is a schematic view to explain PEB process by a heating apparatus used in the fourth embodiment. In FIG. 14, the same reference numerals are used to designate portions identical to FIG. 4, and the details are omitted.

Liquid stream of pure water 301 is formed on the resist film 104. A transparent plate 302 transmitting irradiation light is located above the resist film 104. Pure water 301 is filled in the space between the transparent plate 302 and the surface of the resist film 104.

Light from a halogen lamp light source (not shown) outside the heating head 213 is guided via optical fiber 212, and irradiated to and the surface of the resist film 104 from the heating head 213. The irradiated light, that is, the wavelength from 2.2 to 3.5 $\mu$m pure water absorbs cut by a filter (not shown).

During heating by light irradiation, liquid stream of pure water is formed on the resist film surface by water stream forming means and temperature control means (not shown). In this case, these means control the temperature and flow speed of the liquid stream. The heating section (heating head) scans the wafer from the one end to the other end o the wafer so that desired heat treatment can be carried out on the wafer surface. In the fourth embodiment, the heating head is divided into several parts in the direction vertical to the scanning direction, and each luminance is independently controlled. In the embodiment, the heating head group comprising several heating heads is formed into a slit (rectangle) shape having a length of 320 mm and a width of 6 mm. The direction of the liquid stream of pure water 301 is reverse to the moving direction of the heating section. Liquid stream having arbitrary direction may be formed.

In view of resist dimension uniformity in the wafer surface after development, uniform calorie must be applied to the wafer surface in PEB process. The calorie is controlled in the same manner as the first embodiment.

Uniform PEB process is carried out in the wafer surface using the heating apparatus, and thereafter, the wafer is carried out of the apparatus in a state that pure water liquid film is formed on the resist film surface. The wafer is carried to a developer in a state that pure water liquid film is formed on the resist film surface, and developed using alkali developer. In this case, pure water existing on the resist film surface must be effectively substituted for the alkali developer. Here, a developer disclosed in JPN. PAT. APPLN. KOKAI No. 2002-252167 may be used as the developer. After development is completed, dry process is carried out, and thus, resist pattern is formed.

As described above, according to the lithography process using immersion exposure, liquid film formed on the resist film surface after exposure process is subjected to development process without drying it. Therefore, it is possible to lithography process simplifying the process.

PEB process is carried out in water; therefore, acid generated from the resist film surface is trapped by pure water. As a result, it is possible to greatly prevent acid from adsorption to the resist film surface. Thus, effective exposure dose has no variations by adsorbed acid in the wafer surface; as a result, resist dimension uniformity can be improved. More specifically, the dimension variation is reduced from 6.7 to 4.1 nm at 3$\sigma$ in the wafer surface of repeated pattern having the ling dimension of 100 nm and the space dimension of 100 nm.

In the fourth embodiment, light from the light source is guided into the apparatus via several optical fibers. The present invention is not limited to the structure described above; in this case, light from lamp may be directly irradiated. In the embodiment, halogen lamp is used as the light source. The present invention is not limited to the halogen lamp; in this case, any other lamps may be used so long as they have a wavelength range where resist does not exposure and can heat. It is desirable to select light having a wavelength having no absorption to liquid on the resist film surface.

In the embodiment, the heating head used as the heat source is moved in the wafer while scanning selective heating range. The same effect is obtained even if the stage holding the wafer is moved in a state of fixing the heating head.

In the embodiment, repeated pattern having the line dimension of 100 nm and the space dimension of 100 nm is used. The present invention is not limited to the pattern; in this case, the same effect is obtained even if other patterns are used.

In the embodiment, the process until development is carried out in a state that liquid film is formed, and the present invention is not limited to the process. For example, the humidity is controlled to 80% or more during process, and thereby, wafer is processed without drying liquid on the resist film surface. In this case, there is no need of effectively substituting pure water for alkali developer in development; therefore, a normal developer may be used. Besides, various modifications may be made in the invention without diverging from the spirit and scope.

(Fifth Embodiment)

Figure 15:
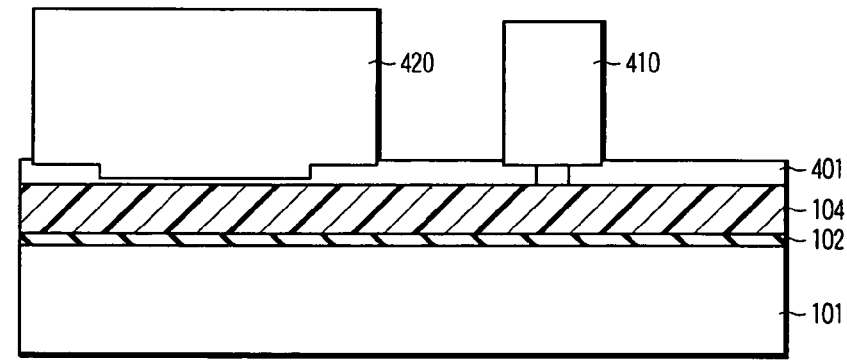
FIG. 15 is a view schematically showing the structure of a processing apparatus according to a fifth embodiment.

FIG. 15 is a view to explain the structure of a processing apparatus according to a fifth embodiment of the present invention.

As shown in FIG. 15, the processing apparatus includes a PEB head 410 for carrying out PEB process by lamp irradiation, and a development head 420 for carrying out development. The PEB head 410 moved to one direction by moving mechanism (not shown) while irradiating light to the resist film 104 having liquid film 401 on the surface, like the first embodiment. The development head 420 moved to one direction by moving mechanism (not shown) while carrying out development.

Figure 16:
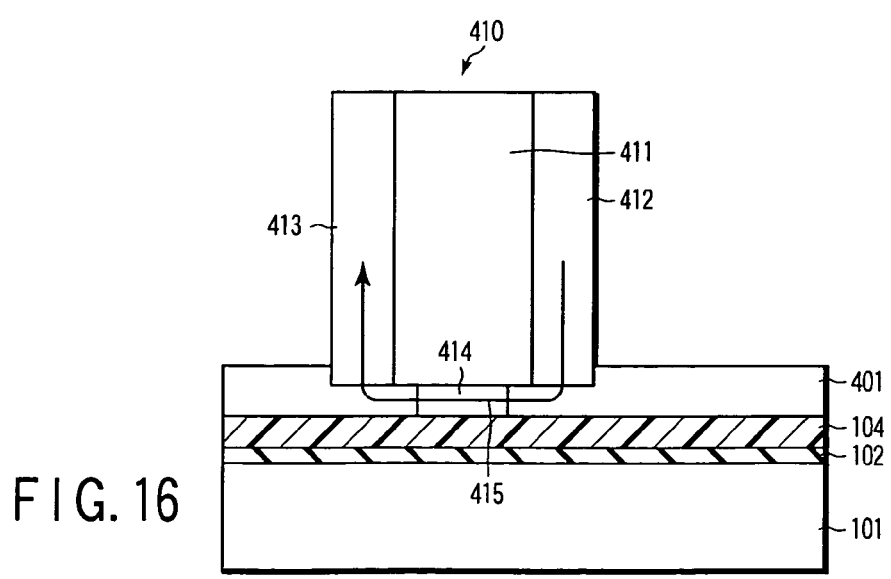
FIG. 16 is a view showing the structure of a PEB head according to the fifth embodiment.

The structure of the PEB head 410 will be described with reference to FIG. 16. FIG. 16 is a view to explain the structure of the PEB head 410 according to the fifth embodiment of the present invention. As illustrated in FIG. 16, the PEB head includes a light heating section 411, a supply section 412 and a sucker 413. Supply section 412, light heating section 411 and sucker 413 are arranged successively from the forward side of the moving direction of the PEB head 410.

The light heating section 411 guides light from halogen lamp source located outside the PEB head 410 to the light heating section 411 via optical fiber, and irradiates the light to the surface of the resist film 104, as described in the first embodiment. In this case, the halogen lamp source may be arranged in the light heating section 411.

The supply section 412 supplies pure water to the resist surface. The sucker 413 sucks pure water on the resist film 104. The supply section 412 and the sucker 413 operate so that liquid stream 415 can be generated in a heating section by light 414.

A development solution and rinse liquid supply unit disclosed in FIG. 5 of JPN. PAT. APPLN. KOKAI No. 2002-252167 may be used as the development head 420.

The method of forming resist pattern using the processing apparatus will be described below.

The anti-reflection film and the resist film are formed, and thereafter, exposure is carried out using an immersion type aligner (exposure system), like the third embodiment.

Figures 17A, 17B:
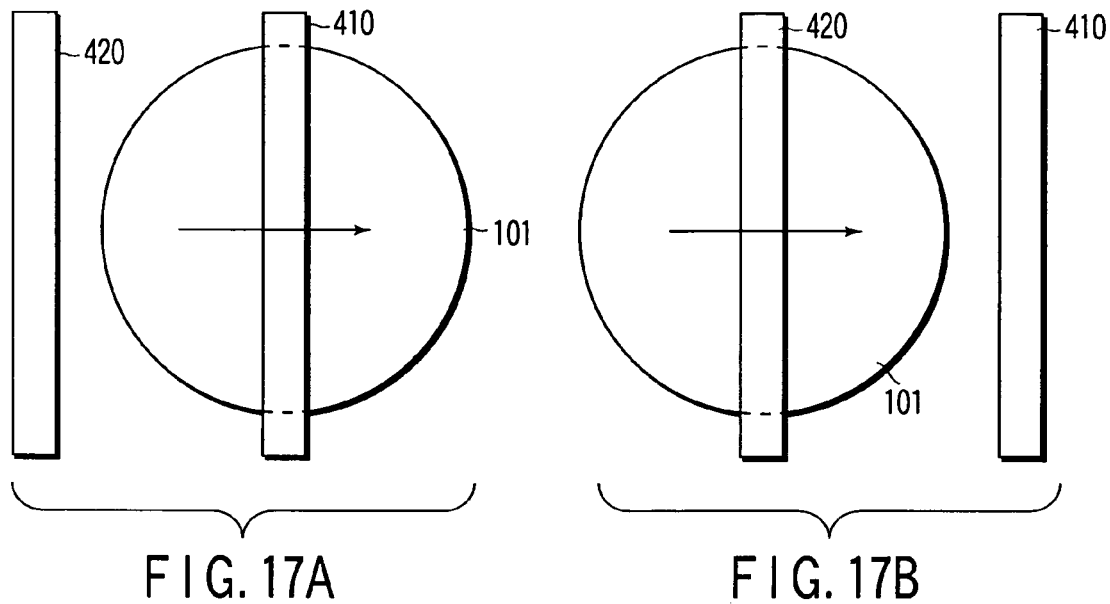
FIG. 17A and FIG. 17B are plan views to explain the treatment using the processing apparatus according to the fifth embodiment.

Latent image is formed using the immersion type aligner, and thereafter, wafer is carried out of the immersion type aligner in a state that pure water liquid film is formed on the resist film surface. The wafer is carried to the processing apparatus shown in FIG. 15 in a state that pure water liquid film is formed on the resist film surface. The process by the processing apparatus will be described with reference to FIG. 17A and FIG. 17B. FIG. 17A and FIG. 17B are plan views to explain the process using the processing apparatus according to the firth embodiment of the present invention.

As shown in FIG. 17A, the PEB head 410 scans the surface of the resist film 104 to carry out PEB process in a state that pure water liquid film is formed on the resist film 104. After PEB process, the pure water liquid film is kept in a state of being formed. This state is realized in a manner of controlling pure water supply speed from the supply section 412 and pure water suction speed from the sucker 413 in accordance with the scan speed of the PEB head 410.

After PEB process, the development head 420 scans the surface of the resist film 104 while developing it in a state that pure water liquid film is formed on the resist film 104, as shown in FIG. 17B.

As described above, according to the lithography process using immersion exposure, liquid film formed on the resist film surface after exposure process is subjected to development process without drying it. Therefore, it is possible to lithography process simplifying the process.

PEB process is carried out in water; therefore, acid generated from the resist film surface is trapped by pure water, and thereafter, sucked by the sucker. As a result, it is possible to greatly prevent acid from adsorption to the resist film surface. Thus, effective exposure dose has no variation by adsorbed acid in the wafer surface; as a result, resist dimension uniformity can be improved. More specifically, the dimension variation is reduced from 7.2 to 4.1 nm at 3σ in the wafer surface of repeated pattern having the ling dimension of 120 nm and the space dimension of 150 nm.

The processing apparatus of the fifth embodiment is used, and thereby, PEB process and development process are simultaneously carried out. Therefore, it is possible to make compact the apparatus for carrying out PEB and development. PEB and development processes are carried out in the identical apparatus, and thereby, process time can be shortened. If the scan speed of the PEB head 410 is faster than that of the development head 420, the PEB head 410 and the development head 420 may simultaneously scan the wafer surface. If the scan speed of the PEB head 410 is approximately the same as that of the development head 420, process may be carried out using a head integrated with the PEB head 410 and the development head 420.

In the fifth embodiment, repeated pattern having the line dimension of 120 nm and the space dimension of 150 nm is used. The present invention is not limited to the pattern; in this case, the same effect is obtained even if other patterns are used.

There is the case of carrying out no PEB process depending on the kind of resist. In this case, development process is made without carrying out the PEB process. In also case, it is preferable to carry out development using the immersion aligner without drying liquid on the resist film. Development is carried out without removing liquid film formed during exposure, and thereby, there is no need of carrying out the process of drying the liquid film. When drying liquid film, liquid stain is formed on the resist surface. However, no liquid stain is formed because there is no need of carrying out dry process. If the liquid stain is formed, wettability of developer to resist film changes. As a result, resist pattern formed after development becomes non-uniform. However, dry process is not carried out; therefore, it is possible to prevent non-uniformity of resist pattern due to the liquid stain.

(Sixth Embodiment)

Anti-reflection film and resist film coating, exposure and development processes overlap with the first embodiment; the details are omitted. Only PEB process will be described below.

Figure 18:
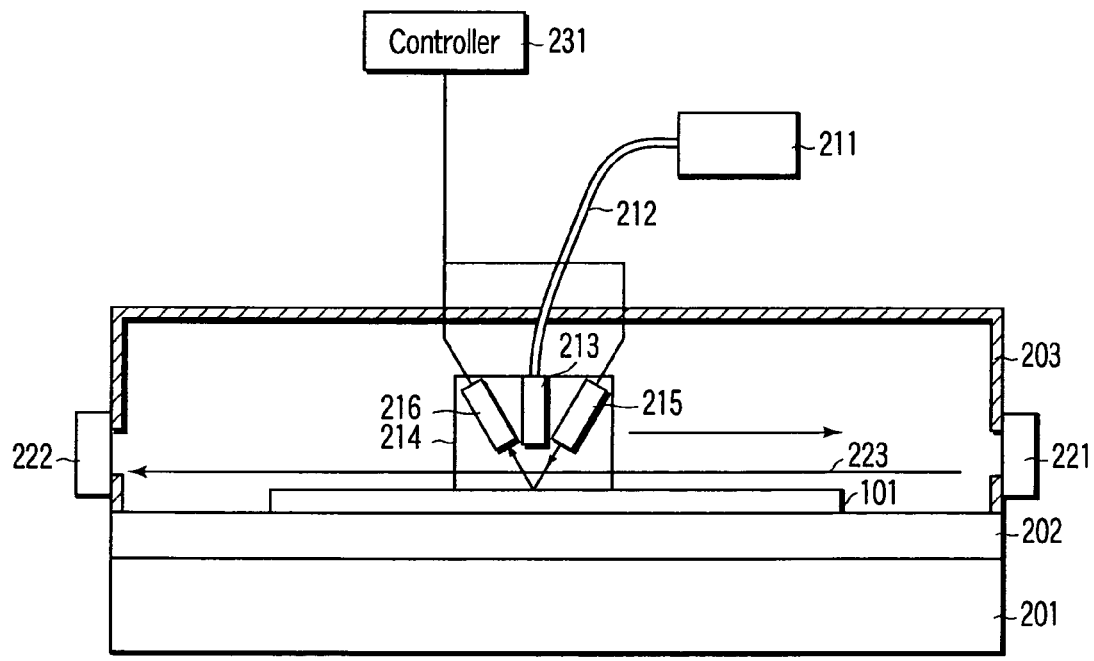
FIG. 18 is a perspective view schematically showing the structure of a heating apparatus according to a sixth embodiment.

FIG. 18 is a schematic view the structure of a heating apparatus according to a sixth embodiment of the present invention. In FIG. 18, the same reference numerals are used to designate the portions identical to FIG. 4, and the explanation is omitted.

In the heating apparatus, PEB process is carried out while observing the processing condition of resist film in the irradiation range to which light from heating head 213 is irradiated. Monitor light heating head 215, monitor light receiving head 216, and controller 231 monitor the processing condition. The monitor light heading head 215 irradiate monitor light onto the resist film 104 of the range to which light is irradiated. The monitor light receiving head 216 receives monitor light reflected by the resist film 104, and measures light intensity distribution. Preferably, the light intensity distribution is given by measuring the moving direction distribution of the heating range. The light intensity distribution transmits the measured light intensity distribution to the controller 231. More specifically, the heating process monitoring method disclosed in JPN. PAT. APPLN. KOKAI No. 2000-82661 may be employed.

The controller 231 calculates the processing condition of the heating range from the light intensity distribution. If the process of the heating range is late, the controller 231 reduces the flowing speed of air stream 223 to prevent cooling to the heating range. Conversely, the controller 231 increases the flowing speed of air stream 223 to facilitate cooling to the heating range. As described above, heating is carried out while acquiring processing information, and thereby, heating is uniformly carried out with respect to the wafer surface.

The process control of the heating range is not limited to the method of controlling the speed of air stream 233. For example, control may be made with respect to at least one of speed and temperature of the air stream, substrate temperature by temperature control plate 202, heating temperature by heating head 213 and scan speed of heating section 213. The control may be applied to the heating apparatus carrying out heating while forming liquid stream and not air stream.

Measurement means for measuring temperature by measuring infrared light emitted from the heating range may be provided in addition to monitor light heading head 215 and monitor light receiving head 216. Several temperature measurement means such as thermal couples may be arranged in the heating range thermally separating from the temperature control plate 202 on which the substrate 101 is placed, along the moving direction of the heating range. The controller 231 carries out control in accordance with the measured result of these measurement means.

(Seventh Embodiment)

Figure 19:
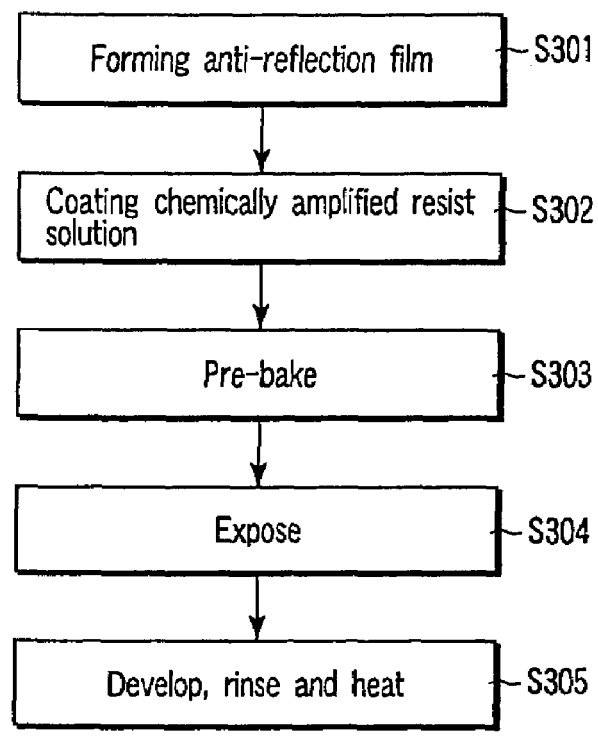
FIG. 19 is a flowchart to explain the method of forming resist film according to a seventh embodiment.

FIG. 19 is a flowchart to explain the method of forming resist film according to a seventh embodiment of the present invention. FIG. 20A to FIG. 20D are cross-sectional views showing the process of manufacturing a semiconductor device according to the seventh embodiment of the present invention.

(Step S301)

As shown in FIG. 2A, an anti-reflection film 102 having a thickness of 60 nm is formed on a semiconductor substrate (hereinafter, referred to as wafer) 101 having a diameter of 200 mm. The anti-reflection film 102 is formed in a manner of carrying out bake process at 190° C. for 60 seconds after forming a liquid film containing anti-reflection agent and solvent by spin coating.

(Step S302)

As illustrated in FIG. 2B, the wafer 101 is coated with chemically amplified resist solution in which positive-tone chemically amplified resist material is added to solvent, and thereby, liquid film 401 is formed.

The following processes may be carried out to coat resist solution. One is meniscus coating using capillary phenomenon, and another is coating by reciprocating a very-thin nozzle on the substrate. In addition, another is spray coating of spraying chemical liquid. In the embodiment, liquid film is formed using the above-mentioned coating by reciprocating a very-thin nozzle on the substrate.

(Step S303)

Figure 21:
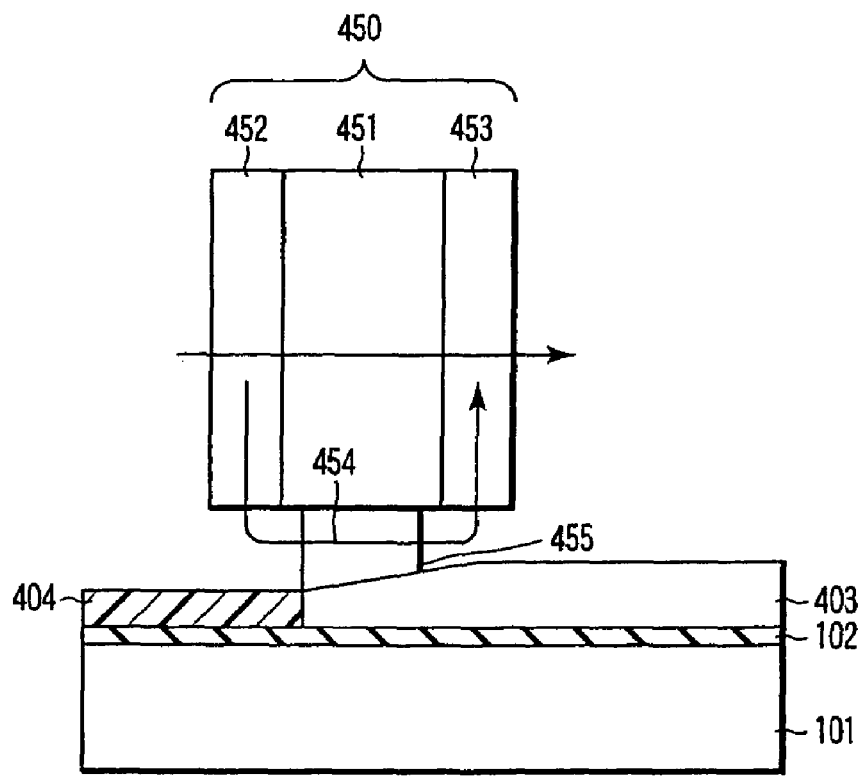
FIG. 21 is a view schematically showing the structure of the heating apparatus according to the seventh embodiment.
Figure 20A:
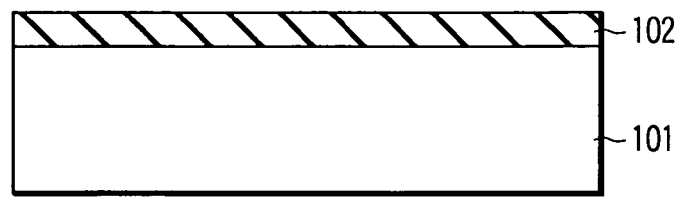
FIG. 20A to FIG. 20D are cross-sectional views showing the process of manufacturing a semiconductor device according to the seventh embodiment.
Figure 20B:
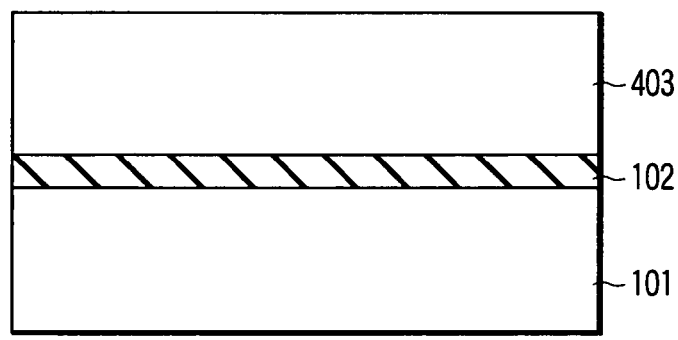
Figure 20C:
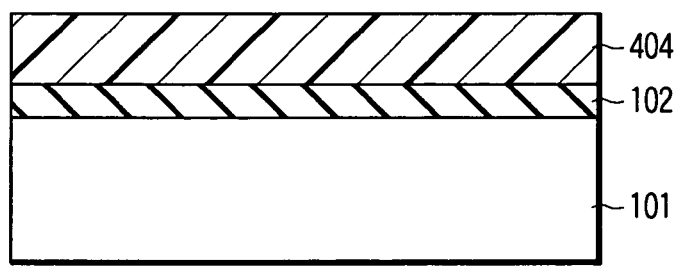
Figure 20D:
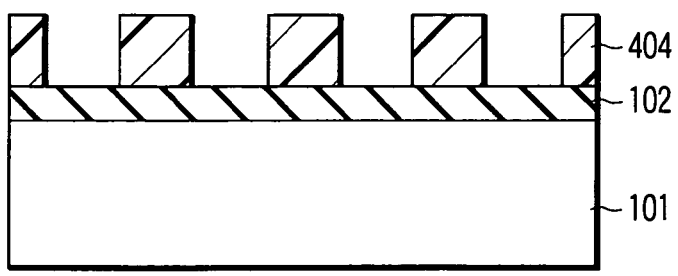

Wafer is carried to a heating apparatus shown in FIG. 21, and thereafter, heating is carried out. Heating volatilizes solvent contained in the liquid film 403, and thereafter, dry process is carried out. As depicted in FIG. 20C, resist film 404 is formed. The explanation will be made below.

FIG. 21 is a view schematically showing the structure of a heating apparatus according to the seventh embodiment of the present invention. The entire apparatus structure is the same as the first embodiment; therefore, the details are omitted herein.

A heating head 450 includes a heating section 451, an air blower 452 and an air sucker 453. The heating section 541 irradiates light 455 supplied from one halogen lamp light source (not shown) via optical fiber (not shown) to the liquid film 403. The air blower 452 is arranged on the backward side in the moving direction of the heating head 450. The air sucker 453 is arranged on the forward side in the moving direction of the heating head 450.

Gas is introduced into the wafer 101 from the air blower 452, and sucked by the air sucker 453, and thereby, air stream 454 is formed. The air stream 454 flows from the backward side to the forward side in the moving direction of the heating head 450. The wafer 101 is placed on a stage (not shown), which is controlled to 23° C.in temperature. By doing so, the range to which light is irradiated is selectively heated.

Heating by the irradiation of light 455 volatilizes solvent contained in the liquid film 401. The volatilized solvent is carried to the downstream side by the air stream 454. The air sucker 453 is located adjacent to the heating section 451, so that the amount of solvent adhering again to the surface of the resist film 404 can be reduced.

The light 455 from the heating section 451 is irradiated, and the irradiated light facilitates heating and drying. The heating head 450 is moved by a moving mechanism (not shown) while scanning from the left to the right in the drawing. The heating head 450 moves from one end of the wafer 101 to the other end thereof while scanning the wafer, and thereby, resist dry by heating is performed on the entire surface of the wafer.

As descried above, heating is carried out under stream atmosphere flowing from the downstream side to the upstream side to the scanning direction of the heating head.

By doing so, dry process is carried out with high precision without giving influence to the area where dry process is made.

(Steps S304 and S305)

The aligner exposes the wafer. As seen from FIG. 20D, development and dry processes are carried out, and resist pattern 404 is formed. If the resist film 404 is chemically amplified resist, PEB process must be carried out. The PEB process may be made using the apparatus and method shown in the foregoing embodiments.

In the seventh embodiment, processing head is carried out under stream atmosphere flowing from the downstream side to the upstream side to the scanning direction of the heating head. The present invention is not limited to the embodiment. The direction of the air stream may be changed in accordance with the kind of liquid film. The seventh embodiment is applied to the process of forming resist film. In this case, the seventh embodiment may be applicable to the process of forming insulating film and metal film.

The present invention is not limited to the embodiments described above, and various modifications may be made in the invention without departing from the spirit or scope of the inventive concept. The respective embodiments include various inventive steps, and disclosed several constituent requirements are properly combined, and thereby, various inventions are obtained. Even though some are deleted from all constituent requirements shown in the embodiments, it is possible to solve the problem described in the column of "Problem that the invention is to solve". If the effect described in the column of "Effect of the invention" is obtained, the deleted constituent requirements can be selected as the invention.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A heating apparatus comprising:
   a holding section configured to hold a substrate;
   a heating section arranged in a state of facing the surface of the substrate held by the holding section, and selectively heating a partial range of the substrate;
   a moving section configured to relatively move the heating section and the substrate in a direction of relative motion parallel to the main surface of the substrate;
   a stream forming section configured to form gas or liquid stream between the heating section and the substrate, the gas or liquid stream being along the direction of relative motion of the heating section and the substrate;
   a processing condition determining section configured to determine processing conditions of the partial range heated by the heating section; and
   a controller configured to uniformly heat the substrate surface based on determination by the processing condition determining section.

2. The apparatus according to claim 1, wherein:
   the stream forming section comprises a supply section and a sucking section, which are arranged on both sides of the heating section in the direction of relative motion of the heating section and the substrate,
   the supply section supplies gas or liquid toward the sucking section, and
   the sucking section sucks gas or liquid supplied from the supply section.

3. The apparatus according to claim 2, wherein the supply section and the sucking section are located adjacent to the heating section.

4. The apparatus according to claim 1, further comprising:
   a measurement section configured to measure the temperature of the partial range heated by the heating section,
   the processing condition determining section determining processing conditions of the partial range in accordance with the measured result by the measurement section.

5. The apparatus according to claim 1, further comprising:
   a detection section configured to irradiate monitor light to the partial range, and detecting an intensity of light reflected from the partial range,
   the processing condition determining section determining processing conditions of the partial range based on the detection result by the detection section.

6. The apparatus according to claim 1, wherein the heating section heats the substrate using thermal conduction from a heater or radiation from a light source.

7. The apparatus according to claim 6, wherein the light source is any of lamp, light emitting diode and laser.

8. The apparatus according to claim 7, wherein the heating section irradiates light emitted from the light source to the substrate.

9. The apparatus according to claim 7, further comprising:
   optical fiber connecting the light source and the heating section, and guiding light from the light source to the heating section.

10. The apparatus according to claim 7, wherein the light from the light source contains a wavelength equivalent to infrared-ray range.

11. The apparatus according to claim 1, wherein the holding section includes a temperature controller for controlling the substrate temperature.

12. The apparatus according to claim 11, wherein the temperature controller controls the substrate temperature based on determination information of the processing condition determining section.

13. The apparatus according to claim 1, wherein the stream forming section controls at least one of the speed of gas or liquid stream and the temperature of gas or liquid stream based on determination of the processing condition determining section.

14. The apparatus according to claim 1, further comprising:
   a developer supply section arranged on the backward side in the relatively moving direction of the heating section, and movable relatively to the substrate while supplying developer thereto.

15. The apparatus according to claim 1, wherein said steam forming section forms the gas or liquid stream opposite to the direction of relative motion of the heating section and the substrate.

16. The apparatus according to claim 1, wherein said moving section reduces a relative speed of the heating section and the substrate when the heating section is located to an edge portion of the substrate.

17. The apparatus according to claim 1, wherein said heating section makes a process temperature of the substrate high when the heating section is located to an edge portion of the substrate.

* * * * *

UNITED STATES PATENT AND TRADEMARK OFFICE
CERTIFICATE OF CORRECTION

PATENT NO. : 7,009,148 B2
DATED : March 7, 2006
INVENTOR(S) : Kawano et al.

It is certified that error appears in the above-identified patent and that said Letters Patent is hereby corrected as shown below:

Column 18,
Line 54, change "steam forming" to -- stream forming --.

Signed and Sealed this

Twenty-third Day of May, 2006

JON W. DUDAS
*Director of the United States Patent and Trademark Office*